United States Patent [19]

Washio et al.

[11] Patent Number: 4,694,321

[45] Date of Patent: Sep. 15, 1987

[54] SEMICONDUCTOR DEVICE HAVING BIPOLAR TRANSISTOR AND INTEGRATED INJECTION LOGIC

[75] Inventors: Katsuyoshi Washio; Makoto Hayashi, both of Hachioji; Tomoyuki Watanabe, Tokyo; Takahiro Okabe; Katuhiro Norisuye, both of Kodaira, all of Japan

[73] Assignees: Hitachi, Ltd.; Hitachi Microcomputer Engineering, Ltd., both of Tokyo, Japan

[21] Appl. No.: 755,912

[22] Filed: Jul. 17, 1985

[30] Foreign Application Priority Data

Jul. 18, 1984 [JP] Japan ............................... 59-147535

[51] Int. Cl.[4] .................... H01L 27/04; H03K 19/091

[52] U.S. Cl. ........................................ 357/48; 357/50; 357/55; 357/89; 357/92

[58] Field of Search ....................... 357/92, 89, 55, 50, 357/48

[56] References Cited

U.S. PATENT DOCUMENTS 4,157,268 6/1979 Bergeron et al. .................... 357/55
4,258,379 3/1981 Watanabe ............................. 357/92
4,420,874 12/1983 Funatsu ................................ 357/92

FOREIGN PATENT DOCUMENTS 55-13585 4/1980 Japan .

*Primary Examiner*—William D. Larkins
*Attorney, Agent, or Firm*—Antonelli, Terry & Wands

[57] ABSTRACT

A semiconductor integrated circuit device incorporating bipolar transistors and IILs comprises respective buried layers in a substrate and active regions. A buried layer formed in the IIL region has a larger Gummel number than that of a buried layer formed in the bipolar transistor region so that a leakage current to the substrate is prevented. A larger Gummel number of the buried layer is accomplished by increasing the impurity concentration or the thickness of the layer. The device structure allows an enhanced circuit packing density, while suppressing a leakage current to the substrate.

7 Claims, 5 Drawing Figures

4 3 11 20 5 4 30 6 4 7 30 3 11 4 8 201 4 9 301 4 9 4 301 10 2011 3 11 4
11 N P+ N N+ P+ N+ P+ N P+ N+ N+ P+ P+ N
N+ N+ D P
2 1 22
100 200

SEMICONDUCTOR DEVICE HAVING BIPOLAR TRANSISTOR AND INTEGRATED INJECTION LOGIC

BACKGROUND OF THE INVENTION

The present invention relates to a semiconductor device incorporating a bipolar integrated circuit and an integrated injection logic (IIL or $I^2L$).

The conventional device shown in FIG. 1 is structured for its IIL section 200 to have an $n^+$-type buried layer 21 made of impurity with a high diffusivity in order to improve the current gain and operating speed of the IIL and enhance the breakdown voltage of the bipolar transistor, resulting in an upward-diffusion structure of the $n^+$-type buried layer 21 expanding into an n-type epitaxial layer 11 to a much greater extent than the buried layer 2 for a bipolar transistor section 100, as described in Japanese Patent Publication No. 55-13585. In fabricating the above-mentioned structure, buried layers 2 and 21 and an epitaxial growth layer 11 are formed on a substrate 1. p-type impurity regions 3 are formed to isolate the component regions, in which p-type impurity regions 20, 201 and 2011 are formed. Thereafter, n-type high-impurity concentration regions 30 and 301 are formed in the p-type impurity regions 20 and 2011 and in the n-type epitaxial growth layer 11. Finally, electrodes 5, 6, 7, 8, 9 and 10 are formed on the respective regions.

In such a prior art arrangement, the buried layer 21 has its upper and lower diffusing portions having an extremely low impurity concentration. Accordingly, a high-impurity concentration $n^+$-type buried layer 211 in the IIL section 200 has a depth D comparable with the depth d of the buried layer 2 in the bipolar transistor section 100, and there is no significant difference in the Gummel numbers (which represents the integrated value of impurity concentration) of the $n^+$-type buried layers between the bipolar section and the IIL section. On this account, no special consideration has been made in this prior art device structure regarding the problem that a current flowing through the buried layer to the substrate increases as the depth of the $n^+$-type buried layer is decreased for minimizing the thickness of the component.

SUMMARY OF THE INVENTION

An object of this invention is to provide a semiconductor device which allows the coexistence of a high density bipolar integrated circuit and a high current gain IIL when the components are intended to have shallow junctions.

In order to achieve the above objective, the present semiconductor device is featured by providing a shallow buried layer for the bipolar integrated circuit region and a deep buried layer extending to the substrate or a buried layer with a large Gummel number for the IIL region.

DESCRIPTION OF THE PREFERRED EMBODIMENTS

Embodiments of the present invention will be described with reference to the drawings, in which like symbols designate like elements and like portions throughout the figures.

EMBODIMENT 1

Figure 1:
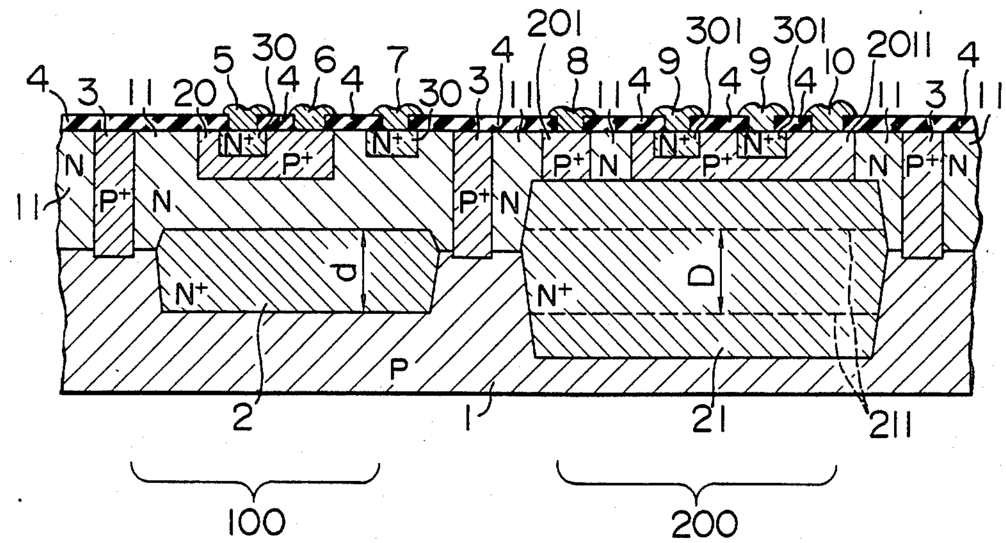
FIG. 1 is a partial cross-sectional view of the conventional semiconductor device including an IIL and a bipolar transistor.
Figure 2:
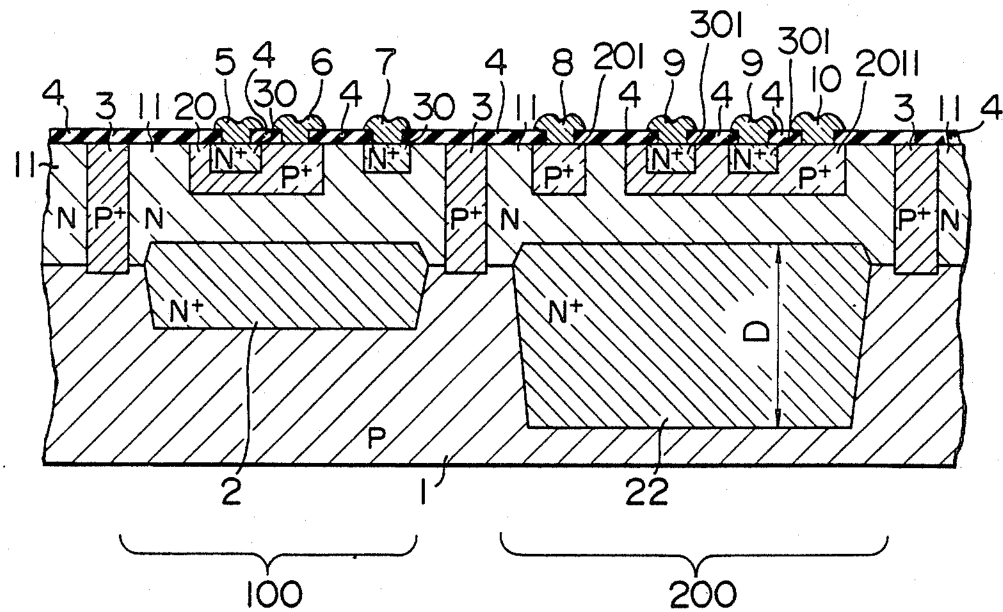
FIG. 2 is a cross-sectional view of the first embodiment of this invention.

FIG. 2 shows a typical semiconductor integrated circuit incorporating a bipolar integrated circuit and IIL, i.e., an npn transistor 100 and IIL 200 as shown. The IIL operates in an inverse mode oppositely to the usual npn transistor, with its electrode 9 serving as a collector, electrode 10 as a base, and its buried layer 22 as an emitter. In operation, holes are injected from an injector p-layer 201 through an n-layer 11 into a p-layer 2011. When it is intended to increase the packing density by reducing the depth of elements, reduction in the depth D of the buried layer 22 to make it smaller than the hole diffusion length in the $n^+$-type buried layer 22 causes an increase of current passing through the buried layer and reaching the substrate 1. Consequently, the current injected to the injector electrode 8 increases, causing increased power dissipation. For the same reason the hole current from the p-layer 2011 increases due to the current flowing to the substrate 1, resulting in a decreased current gain.

This invention contemplates preventing the current from reaching the substrate and increasing the current gain, while reducing the power dissipation. For this purpose, the $n^+$-type buried layer 22 in the IIL section is formed to have a larger Gummel number than that of the $n^+$-type buried layer 2 in the bipolar transistor section by increasing the impurity concentration of the buried layer or increasing the thickness of the buried layer. The former method poses a limit of concentration to a certain value due to defects or unwanted auto-doping caused by the subsequent process. Therefore, this invention adopts the method of virtually increasing the Gummel number by increasing the thickness of the buried layer, while leaving the impurity concentration at the maximum possible level (about $1\times10^{20}/cm^3$ in the case of As), thereby preventing holes injected into the buried layer from reaching the substrate.

Generally, the buried layer of the bipolar transistor section has increased lateral dimensions in proportion to the increase in the depth, which prevents high packing density of components. Whereas, since the $n^+$-type buried layer of IIL is used as a large ground-potential emitter island, its lateral expansion due to an increased depth has lttle effect on the packing density. In consideration of a decreased thickness of the n-type layer 11 resulting from a vertical reduction of components, the n-type buried layer 22 of the IIL section is formed to have the same amount of diffusion as the buried layer 2 of the bipolar transistor section toward the n-type layer 11, whereby the junction capacitance between the p-type base region 2011 and the n-type emitter region 11 in the IIL section is prevented from increasing and then power dissipation of the device is reduced.

As a specific embodiment of this invention, a substrate with an impurity concentration of $2\times10^{15}/cm^3$ is overlaid by an epitaxial growth layer with an impurity concentration of $5\times10^{15}/cm^3$ and a thickness of 2 μm, following the introduction of impurity for forming the buried layers 2 and 22. The buried layer 2 is formed by implanting arsenic (As) to the amount of $1\times10^{16}/cm^2$ at 75 keV, while the buried layer 22 is formed by implanting As to an amount of $1\times10^{16}/cm^2$ at 150 keV and 75 keV with the annealing process taking place between the two implanting processes. The reason for the different implanting energy levels used is to form the buried layer 22 of the IIL section 200 deeper than the buried layer 2 of the bipolar transistor section 100 as shown in FIG. 2.

Other methods for attaining the different thicknesses of layers include a method of introducing antimony gas ($Sb_2O_3$) or the like from a diffusion source to the buried layer 22 longer in time than to the buried layer 2, and a method of forming a deeper n+-type layer in advance by using phosphonic glass ($P_2O_5$) or the like only for the buried layer 22.

Subsequently, the p-type impurity layer 3 is formed following the epitaxial growth process, or through the introduction of p-type impurity, i.e., boron (B), along with the buried layers 2 and 22 prior to the epitaxial growth so as to utilize upward diffusion.

The inventors of this invention have introduced boron ($B^+$) at an amount of $1\times10^{14}/cm^2$ at 50 keV in advance of epitaxial growth, and after the epitaxial growth to an amount of $5\times10^{13}/cm^2$ at 75 keV.

Thereafter, diffusion layers 20, 201, 2011, 30 and 301 are formed by the usual method. Finally, electrodes 5, 6, 7, 8, 9 and 10 are formed by depositing aluminium over the entire surface and then patterning it into desired shapes. Although it is not shown in the figure, the semiconductor surface is coated with a thick oxide film including phosphorus as a passivation film for the purpose of stability.

EMBODIMENT 2

Figure 3:
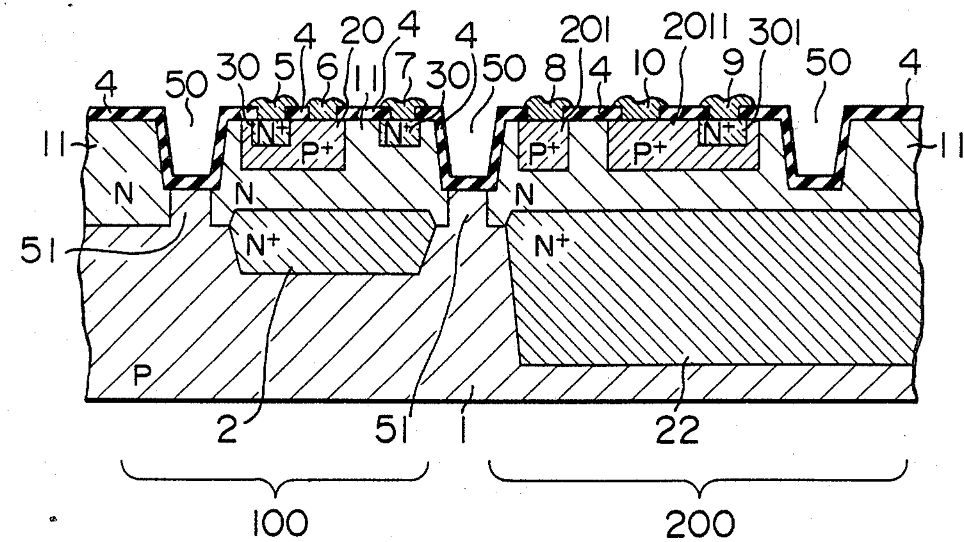
FIG. 3 is a cross-sectional view of the second embodiment of this invention.

FIG. 3 shows the cross section of the inventive semiconductor device, in which grooves 50 formed in an n-type semiconductor layer 11 and p-type impurity regions 51 are used for separating the bipolar integrated circuit and IIL components. This component separating structure is effective for the high density integration of bipolar integrated circuit and for the reduction of lateral diffusion of hole current from the p-layer 201 (injector) and 2011 of the IIL section. The effect of the thick n+-type buried layer 22 on the reduction of the substrate current is enhanced owing to the suppression of lateral diffusion of hole current by the grooves 50.

The n-type layer 11 is formed on the substrate 1 by the epitaxial growth process as in the first embodiment. Thereafter, the grooves 50 are formed by etching, which is preferably so-called dry etching having directivity from the viewpoint of dimensional accuracy. After the grooves 50 have been formed, p-type impurity regions 51 are formed by introducing from the bottom of grooves 50, for example, $B^+$ to an amount of $4\times10^{13}/cm^2$ at 75 keV or by upward diffusion of $B^+$ like in the embodiment 1, and then impurity regions for the respective components are formed as in the first embodiment. The p-type impurity regions 51 can be formed with a smaller area as compared with the p-type impurity regions 3 of the first emboidment, because the former is smaller in depth than the latter. Although the difficulties will be encountered in introducing impurity to the bottom of the grooves 50, this device structure contributes to the enhancement of packing density.

EMBODIMENT 3

Figure 4:
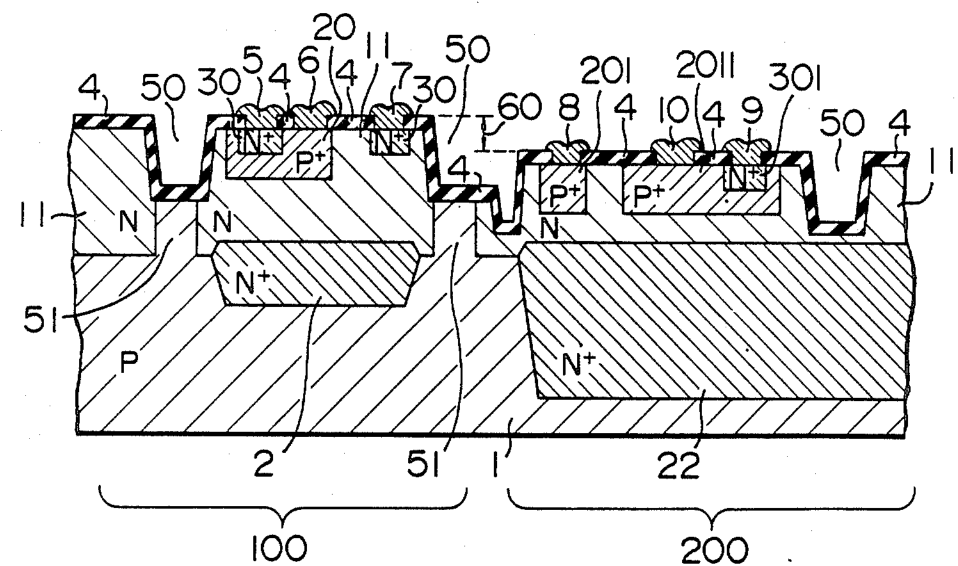
FIG. 4 is a cross-sectional view of the third embodiment of this invention.

FIG. 4 shows the cross-sectional structure of the inventive semiconductor device, in which the n-type semiconductor layer 11 is made to have an offset 60 between sections 100 and 200, so that the n-type semiconductor layer 11 for IIL section between the p-layers 201 and 2011 and the n+-type buried layer 22 becomes thinner, allowing a faster operation of IIL. This structure enables a high-speed IIL without the need of increased upward diffusion of the n+-type buried layer 22 into the n-type semiconductor layer 11.

The fabricating process for the above structure is as follows. The IIL section 200 is etched with the surface of the bipolar transistor section 100 being covered with a protective film so that the epitaxial growth layer 11 of this portion becomes thin. The epitaxial growth layer 11 for the IIL section has a thickness of 1.5 μm and the epitaxial growth layer 11 of the transistor section 100 has a thickness of 2 μm. The remaining parameters such as the impurity concentration are the same as of the first embodiment.

EMBODIMENT 4

Figure 5:
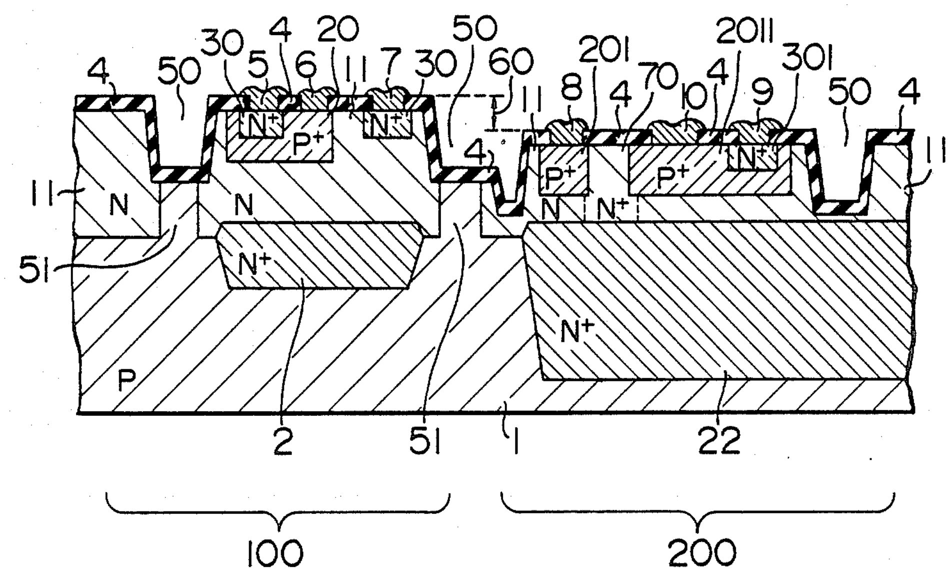
FIG. 5 is a cross-sectional view of the fourth embodiment of this invention.

FIG. 5 shows the cross-sectional structure of the inventive semiconductor device, in which the current flowing from the p-layer 2011 to the p-layer 201 of the IIL section 200 is reduced by providing an n-type diffusion layer 70 having a higher impurity concentration than the n-type semiconductor layer 11, so that the IIL may have an enhanced effective current gain. This structure causes the hole current from the p-layer 2011 to the n+-type buried layer 22 to further increase, and the effect of reducing the unwanted substrate current owing to the n+-type buried layer 22 expanding toward the p-type semiconductor substrate 1 becomes more significant. The n-type impurity region 70 if formed with a concentration of $5\times10^{16}/cm^3$. The remaining parameters are the same as of the third embodiment.

According to the present invention as described above, a semiconductor integrated circuit incorporating a bipolar integrated circuit and an IIL can have an increased current gain and reduced power dissipation without sacrificing the integration density, and this feature is extremely effective for components having their dimensions reduced in the vertical direction.

Having described specific embodiments of out bearing, it is believed obvious that modification and variation of out invention is possible in the light of the above teachings.

We claim:

1. A semiconductor integrated circuit device incorporating an integrated injection logic (IIL) and an integrated circuit including a bipolar transistor, comprising a semiconductor substrate of a first conductivity type; a semiconductor layer of a second conductivity type formed over said substrate and defining an IIL region and a bipolar transistor region; a plurality of buried layers of the second conductivity type more heavily doped than said semiconductor layer embedded between said substrate and said semiconductor layer, wherein the top surface of a buried layer for said IIL region has substantially the same level as the top surface of a buried layer for said bipolar transistor region, the top surface of each buried layer being defined as the location where the concentration of doping of second conductivity type has decreased to substantially the concentration of said layer; and said buried layer for the IIL region having a thickness larger than that of said buried layer for the bipolar transistor region to such an extent that carriers of the first conductivity type do not reach said substrate.

2. A semiconductor device according to claim 1, wherein said IIL region and said bipolar transistor region are isolated by a groove.

3. A semiconductor device according to claim 2, wherein said semiconductor layer of the second conductivity type has a thickness in the IIL region smaller than a thickness in the bipolar transistor region.

4. A semiconductor device according to claim 3, wherein said IIL region includes an injector region and a base region interposed therebetween with an impurity region having a higher impurity concentration than that of said semiconductor layer in the IIL region.

5. A semiconductor device having therein a bipolar transistor and an integrated injection logic ($I^2L$) comprising:

a semiconductor substrate of a first conductivity type;

a semiconductor layer of a second conductivity type formed over said substrate and defining a first region for said $I^2L$ and a second region for said bipolar transistor;

first and second buried layers of the second conductivity type more heavily doped than said semiconductor layer formed between said first region and said substrate and between said second region and said substrate, respectively; and wherein the top surfaces of said first and second buried layers have substantially the same level, the top surface of each buried layer being defined as the location where the concentration of doping of second conductivity type has decreased to substantially the concentration of the said layer, and wherein the first buried layer has a thickness larger than the second buried layer so that said first buried layer for the $I^2L$ will have a larger Gummel number than that of said second buried layer for the bipolar transistor to prevent a leakage current to the substrate.

6. A semiconductor device according to claim 1, wherein said semiconductor layer of a second conductivity type is a thin epitaxial layer having a thickness of about 2 $\mu m$ or less.

7. A semiconductor device according to claim 5, wherein said semiconductor layer of a second conductivity type is a thin epitaxial layer having a thickness of about 2 $\mu m$ or less.

* * * * *